United States Patent
Khalaf (10) Patent No.: US 10,475,766 B2
(45) Date of Patent: Nov. 12, 2019

(54) MICROELECTRONICS PACKAGE PROVIDING INCREASED MEMORY COMPONENT DENSITY

(71) Applicant: INTEL CORPORATION, Santa Clara, CA (US)

(72) Inventor: Bilal Khalaf, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/473,544

(22) Filed: Mar. 29, 2017

(65) Prior Publication Data

US 2018/0286833 A1 Oct. 4, 2018

(51) Int. Cl.
*H01L 23/48* (2006.01)
*H01L 25/065* (2006.01)
(Continued)

(52) U.S. Cl.
CPC .... *H01L 25/0652* (2013.01); *H01L 23/49816* (2013.01); *H01L 23/49838* (2013.01); *H01L 25/03* (2013.01); *H01L 25/0655* (2013.01); *H01L 25/105* (2013.01); *H01L 25/50* (2013.01); *H01L 24/16* (2013.01); *H01L 24/32* (2013.01); *H01L 24/73* (2013.01); *H01L 24/81* (2013.01); *H01L 2224/16227* (2013.01); *H01L 2224/32225* (2013.01); *H01L 2224/73204* (2013.01); *H01L 2224/81815* (2013.01); *H01L 2225/06517* (2013.01); *H01L 2225/06562* (2013.01); *H01L 2225/06572* (2013.01); *H01L 2225/1023* (2013.01); *H01L 2225/1058* (2013.01); *H01L 2924/15153* (2013.01); *H01L 2924/15159* (2013.01); *H01L 2924/15311* (2013.01)

(58) Field of Classification Search
CPC ......... H01L 25/062; H01L 2225/06562; H01L 23/49816; H01L 25/0652; H01L 25/0655; H01L 24/17
USPC ................................... 257/777, 686
See application file for complete search history.

(56) References Cited

U.S. PATENT DOCUMENTS 5,399,898 A * 3/1995 Rostoker ............. G03F 7/70433
257/499
5,715,144 A * 2/1998 Ameen ............... H01L 25/0657
257/686

(Continued)

*Primary Examiner* — Nitin Parekh (57) ABSTRACT

Examples herein include a solid state drive microelectronics package assembly including a substrate and a plurality of microelectronic components coupled to the substrate. The plurality of microelectronic components may be being separated from one another end-to-end by a component gap. The microelectronics package may further include a die package coupled to the substrate, wherein the die package extends across the component gap and is vertically disposed between the plurality of microelectronic components and the substrate. In some examples, the microelectronics components and the die package are each coupled to the substrate by a plurality of connection components (e.g. a solder ball array). The plurality of connection components may be arranged on the microelectronics components to define one or more open areas devoid of any connection components. The die package may be positioned/nested within the one or more open areas to increase overall microelectronic component density of the microelectronics package.

16 Claims, 7 Drawing Sheets

(51) Int. Cl.
*H01L 23/498* (2006.01)
*H01L 25/03* (2006.01)
*H01L 25/10* (2006.01)
*H01L 25/00* (2006.01)
*H01L 23/00* (2006.01)

(56) References Cited

U.S. PATENT DOCUMENTS

| | | | | |
|---|---|---|---|---|
| 5,760,478 A * | 6/1998 | Bozso | ............... | H01L 24/73 257/685 |
| 5,973,392 A * | 10/1999 | Senba | ............... | H01L 25/0652 257/685 |
| 6,069,793 A * | 5/2000 | Maruyama | ............... | G06F 1/20 165/104.33 |
| 6,150,724 A * | 11/2000 | Wenzel | ............... | H01L 25/0657 257/724 |
| 6,369,448 B1 * | 4/2002 | McCormick | ............... | H01L 25/0652 257/723 |
| 6,521,984 B2 * | 2/2003 | Matsuura | ............... | H01L 23/13 257/668 |
| 6,659,512 B1 * | 12/2003 | Harper | ............... | H01L 25/0657 257/777 |
| 7,045,886 B2 * | 5/2006 | Sawada | ............... | H01L 21/563 257/686 |
| 8,237,271 B2 * | 8/2012 | Cordes | ............... | H01L 21/6835 257/723 |
| 8,691,626 B2 * | 4/2014 | Su | ............... | H01L 21/563 438/108 |
| 8,928,153 B2 * | 1/2015 | Haba | ............... | H01L 23/50 257/777 |
| 9,730,323 B2 * | 8/2017 | Kim | ............... | H01L 25/0652 257/686 |
| 2003/0137041 A1 * | 7/2003 | Blackshear | ............... | G11C 5/04 257/686 |
| 2004/0104475 A1 * | 6/2004 | Wang | ............... | H01L 25/0655 257/686 |
| 2005/0194672 A1 * | 9/2005 | Gibson | ............... | H05K 1/112 257/686 |
| 2008/0315409 A1 * | 12/2008 | Cordes | ............... | H01L 21/6835 257/737 |
| 2013/0015591 A1 * | 1/2013 | Haba | ............... | H01L 24/06 257/778 |
| 2013/0175687 A1 * | 7/2013 | Hu | ............... | H01L 21/56 257/738 |
| 2013/0207261 A1 * | 8/2013 | Thacker | ............... | H01L 24/72 257/738 |
| 2016/0071818 A1 * | 3/2016 | Wang | ............... | H01L 25/0655 257/774 |

* cited by examiner

MICROELECTRONICS PACKAGE PROVIDING INCREASED MEMORY COMPONENT DENSITY

TECHNICAL FIELD

Examples described herein relate generally to microelectronic packages incorporating microelectronic components, and more specifically to a microelectronics package providing increased microelectronic component density.

BACKGROUND

Semiconductor chips are commonly provided as individual, prepackaged units. A standard chip may have a flat, rectangular body with a large front face having contacts connected to the internal circuitry of the chip. Each chip is typically contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel larger than the area of the chip itself.

The demand for more compact physical arrangements of chips has become even more intense with the rapid progress of portable electronic devices. For example, as densities grow in solid state drive (SSD) devices, more memory packages are needed. However, with printed circuit board (PCB) size constraints, there's a limit on how many memory packages may be placed on the PCB.

DETAILED DESCRIPTION

Semiconductor chips containing memory storage arrays, particularly dynamic random access memory chips (DRAMs) and solid state drive (SSD) devices are commonly packaged in single-chip or multiple-chip packages and assemblies. Each package has electrical connections for carrying signals, power, and ground between terminals and the chips therein. Microelectronic packages can incorporate a microelectronic component that is configured to provide memory storage array function, e.g., a microelectronic component that embodies a greater number of active devices to provide memory storage array function than any other function. The microelectronic component may be or include a solid state non-volatile memory package, such as a NAND memory package, or a stacked electrically interconnected assembly of semiconductor chips.

In order to improve storage performance, it is desirable to increase a size or number of microelectronic components in a given microelectronic package. The demand for more compact physical arrangements of chips has become even more intense with the rapid progress of portable electronic devices. However, the overall component footprint defined by microelectronic components represents a design constraint in any physical arrangement on a substrate such as a PCB.

In view of the foregoing, certain improvements can be made to multi-chip microelectronic packages and assemblies in order to increase component density and thus improve performance. These attributes and advantages of the present disclosure can be achieved by the arrangement and assembly of the microelectronic packages and assemblies as described hereinafter. For example, embodiments herein advantageously provide a die package, such as a wafer level chip scale package (WLCSP), positioned within free/unused space between the microelectronic components and the substrate. By stacking the microelectronic components vertically over the die package, density of the components and reduction in the overall footprint of the microelectronic package may be achieved.

As further provided, examples of the disclosure may include a solid state drive microelectronics package assembly for increased microelectronic component density. In some examples, a microelectronics package may include a substrate and a plurality of microelectronic components coupled to the substrate, wherein the plurality of microelectronic components are separated from one another by a component gap. The microelectronics package may further include the die package coupled to the substrate, wherein the die package extends across the component gap and is vertically disposed between the plurality of microelectronic components and the substrate. In some examples, the microelectronics package includes a ball grid array (BGA) connection coupling a first side of each of the plurality of microelectronic components to the substrate. The BGA connection may define one or more open areas devoid of any ball grid components, wherein the die package is positioned within the one or more open areas to increase microelectronic component density of the microelectronics package.

Figure 1:
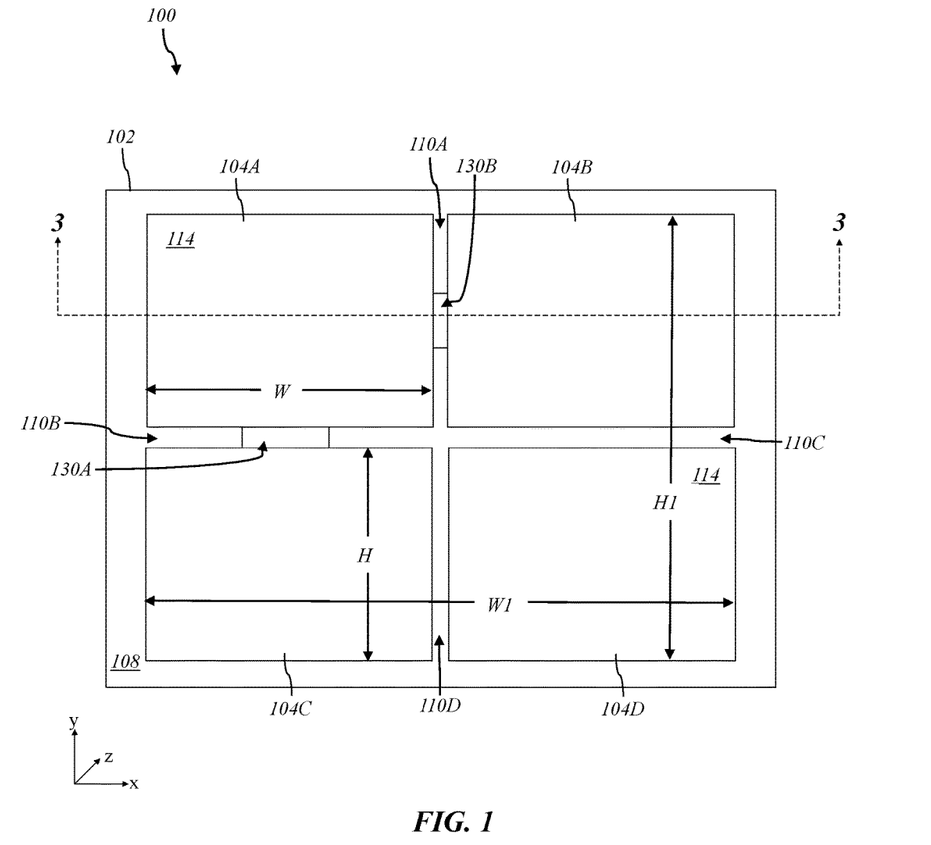
FIG. 1 illustrates a top view of an example microelectronics package.
Figure 2:
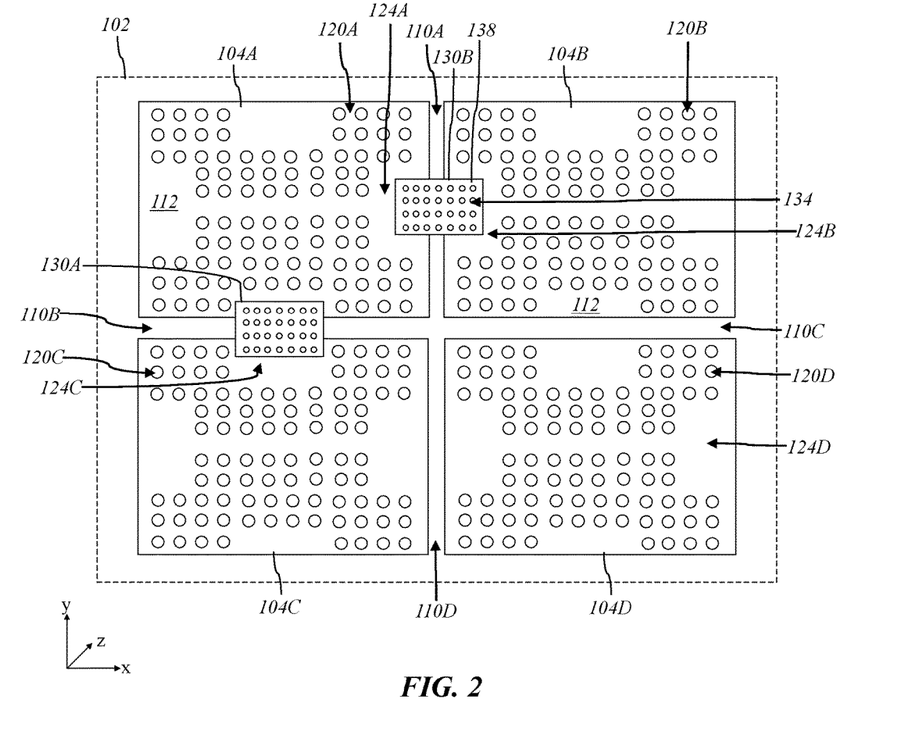
FIG. 2 illustrates a bottom view of the example microelectronics package of FIG. 1.
Figure 3:
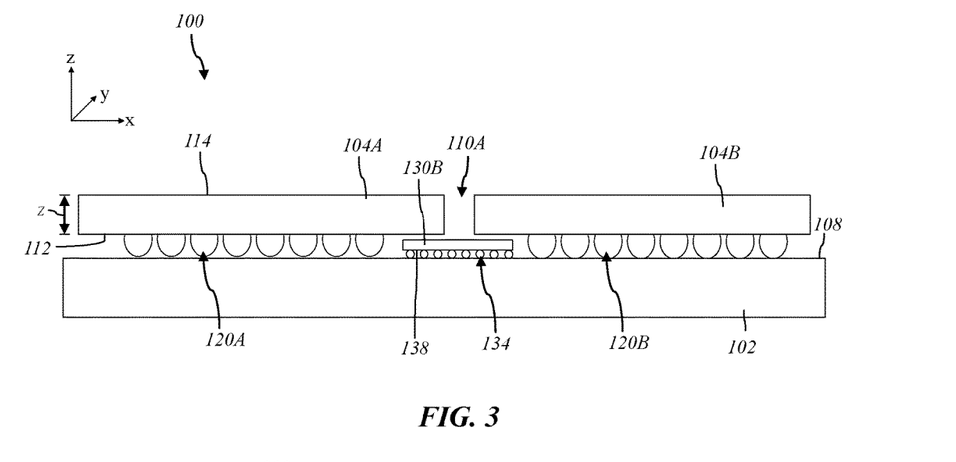
FIG. 3 illustrates a side cross-sectional view of the example microelectronics package of FIG. 1.

Embodiments of the present disclosure provide at least the following advantages. First, the packages of the present disclosure enable increased density of components on a PCB, which provides increased memory, e.g., in SSD devices. In one instance, the total memory may be tripled from 32 TB to 96 TB using the nested/stacked die package and memory component assembly of the present disclosure. Second, the same die placement concept can be used to place low profile passive and active components under the memory components using conventional PCB assembly processes, which increases efficiency and manufacturing throughput. Third, by placing the relatively thin die package on the substrate in an unused area between memory packages, the z-height of the package 100 can be unaffected or even reduced. Fourth, the PCB can be provided with first level interconnect (FLI) scaling capability even with the lowest possible z-height.

Referring now to FIGS. 1-3, an example microelectronics package (hereinafter "package") 100, which may be a memory package device, will be described in greater detail. FIG. 1 illustrates a top view of the package 100, FIG. 2 illustrates a bottom view of the package 100, and FIG. 3 illustrates a side cross-sectional view of the package 100. In some examples, the package 100 may be a semiconductor package or structure. The package 100 may be an integrated circuit (IC) package such as a central processing unit (CPU) and/or can be a microelectronics package or structure. As shown, the package 100 includes a substrate 102, which may be a printed circuit board (PCB), and a plurality of microelectronic components 104A-D coupled to a first side 108 (e.g., a top side) of the substrate 102.

In FIGS. 1-3, for ease of explanation, the x-axis/direction is oriented parallel to a first side 108 of the substrate 102 and may be referred to as a "horizontal" direction, while the y-axis/direction is oriented parallel to the first side 108 and perpendicular to the x-axis, and may be referred to as the "lateral" direction. Furthermore, the z-axis/direction, which is perpendicular to the first side 108, may be referred to as the "vertical" direction. It will be appreciated the directions referred to herein are in the frame of reference of the structures depicted.

As shown, each of the microelectronic components 104A-D may include a width W along the horizontal direction, a height H along the lateral direction, and a thickness Z along the vertical direction. Furthermore, the plurality of microelectronic components 104A-D collectively have an overall width W1 and an overall height H1. As further described herein, by stacking the microelectronic components 104A-D vertically over one or more die packages, density of the package 100 and reduction in the overall footprint defined by W1 and H1 in the x-y plane may be achieved.

In some examples, the substrate 102 may be a material having a low coefficient of thermal expansion ("CTE") in a plane of the substrate 102 (e.g., a plane defined by the x-y directions), the CTE being less than 12 parts per million per degree Celsius (hereinafter, "ppm/° C."). The substrate 102 may be a semiconductor material, e.g., silicon, or a dielectric material such as ceramic material or silicon dioxide, e.g., glass. Alternatively, the substrate 102 may include a sheet-like substrate that can include of a polymeric material such as polyimide, epoxy, thermoplastic, thermoset plastic, or other suitable polymeric material or that includes or consists essentially of composite polymeric-inorganic material such as a glass reinforced structure of BT resin (bismaleimide triazine) or epoxy-glass, such as FR-4, among others. In one such example, the substrate 102 can include a material having a CTE of less than 30 ppm/° C. in the x-y plane of the substrate 102, i.e., along the surface of the first side 108.

In some examples, the plurality of microelectronic components 104A-D of the package 100 each have a first side 112 parallel facing the substrate 102 and a second side 114 opposite the first side 112, wherein the second side 114 faces away from and is generally parallel to the substrate 102. In some examples, each of the plurality of microelectronic components 104A-D are memory packages, such as steady state non-volatile memory devices (e.g., NAND or 3D XPoint™). Each of the microelectronic components 104A-D may be bare chips or microelectronic units each incorporating a memory storage element such as a plurality of NAND flash memory cells. As used herein, a "memory package" may refer to a multiplicity of memory cells arranged in an array, together with circuitry usable to store and retrieve data therefrom, such as for transport of the data over an electrical interface.

In some examples, one or more of the microelectronic components 104A-D may be a 3D XPoint™ memory device, which is a high-speed and high-capacity random access memory device, and which may compliment the low-power characteristics of a memory device. The 3D XPoint™ memory device may have a transistor-less cross-point architecture that creates a three-dimensional checkerboard where memory cells sit at the intersection of word lines and bit lines, allowing the cells to be addressed individually.

In some examples, one or more of the microelectronic elements in any of the memory packages described herein can embody a greater number of active devices to provide memory storage array function than any other function, e.g., as flash memory, DRAM or other type of memory, and can be arranged in a package together with another microelectronic element or "logic chip" that is configured to predominantly provide logic function. In some examples, the logic chip can be a programmable or processor element such as a microprocessor or other general purpose computing element. The logic chip can be a microcontroller element, graphics processor, floating point processor, co-processor, digital signal processor, etc. In a particular embodiment, the logic chip can predominantly perform hardware state machine functions, or otherwise be hard-coded to serve a particular function or purpose. Alternatively, the logic chip can be an application specific integrated circuit ("ASIC") or field programmable gate array ("FPGA") chip. In such variation, the package then may be a "system in a package" ("SIP").

As further shown, each of the microelectronic components 104A-D may have a plurality of component connection elements 120A-D disposed on the first side 112 thereof. In some examples, each of the component connection elements 120A-D may be arranged in one or more columns disposed in central and corner regions of the first side 112 to provide electrical and physical contact with the substrate 102. More specifically, the plurality of component connection elements 120A-D may extend towards the substrate 102 from the first side 112 so as to be in electrical and physical contact with the substrate 102. As such, component connection elements 120A-D are "external" to microelectronic components 104A-D and may be referred to herein as "external component connection elements."

In some examples, each of the component connection elements 120A-D is a ball grid array (BGA) coupling the first side 112 to the substrate 102. More specifically, the BGA connection includes a plurality of solder balls, which can be positioned over corresponding BGA lands (not shown). Each solder ball of the BGA can be, for example, masses of a bond metal such as solder, tin, indium, a eutectic composition or combination thereof, or another joining material such as a conductive paste or a conductive adhesive.

In some examples, the component connection elements 120A-D each define one or more open areas 124A-D devoid of any component connection elements (e.g., solder balls) along the first side 112 of each of the plurality of microelectronic components 104A-D. As will be described in greater detail below, one or more die packages 130A-B may be positioned atop the substrate 102 in an area within/beneath the one or more open areas 124A-D of microelectronic components 104A-D.

The component connection elements 120A-D can be attached to each respective component connection element 120A-D during a solder ball attach process. The solder ball attach process can be a flux printing process or a flux spray process that can be followed by a standard ball placement and reflow process. Flux printing may be possible due to the relatively low thickness of the die packages 130A-B.

As an example solder ball attach process, for an approximately 400 µm BGA pitch, a standard 9 mil solder ball can have a height of approximately 170 µm post reflow. This solder ball height can be sufficient to accommodate a thickness of the die packages 130A-B. After a ball attach process, the microelectronic components 104A-D can undergo a flux dipping and pickup and placement process during which the microelectronic components 104A-D may be coupled to the substrate 102, and followed by mass reflow (e.g., by an original equipment manufacturer (OEM)).

In some embodiments, each die package 130A-B may be a microelectronics semiconductor or SSD die package such as, for example, a silicon die. In other embodiments, each die package 130A-B may be a wafer level chip scale package (WLCSP) including a plurality of die connection elements 134 (e.g., a solder BGA) extending from a first side 138 of the die packages 130A-B. Although not shown, the WLCSP die package may be provided with a redistribution layer (RDL) layer between two dielectric layers. The WLCSP die package may have a first layer of dielectric, a copper metal RDL to re-route the signal path from the die peripheral to a solder ball pad, and a second dielectric layer to cover the RDL metal, which in turn is patterned into the plurality of die connection elements 134. Furthermore, the WLCSP die package advantageously provides a compact package footprint, as well as provides increased functionality, improved thermal performance and finer pitch interconnection to the substrate 102. Still furthermore, the WLCSP die package design is efficient in that the final package size is generally the same as the required circuit area. The manufacturing process steps for the WLCSP die package may be performed in parallel at the silicon wafer level rather than sequentially on individual chips to achieve a package that is essentially the same size as the die.

Each die package 130A-B can be attached to the substrate 102 using standard chip attach and under fill processes. A thickness (e.g., in the z-direction) of the die packages 130A-B can be selected based on PoP pitch and assembly yield, as well as a vertical height/thickness of the plurality of component connection elements 120A-D. As an example, the thickness of the die packages 130A-B can be on the order of approximately 100 μm for a PoP pitch of approximately 300-400 μm.

In some embodiments, the package 100 may have four microelectronic components 104A-D each having a flat, rectangular body, wherein the width W and height H of each microelectronic component 104A-D is greater than a thickness Z. It will be appreciated that a greater or lesser number of microelectronic components may be employed as part of the package 100 in various examples. As shown, the microelectronic components 104A-D are separated from one another, end-to-end along the x-direction and/or the y-direction, by one or more component gaps 110A-D. As presently arranged, the microelectronic components 104A-B are coupled to the substrate 102 along a single x-y plane parallel to the first side 108 of the substrate 102.

One or more die packages may extend across the component gaps 110A-D, between the first side 112 of each of the plurality of microelectronic components 104A-D and the substrate 102. For example, as shown, first die package 130A may extend laterally in the y-direction across the component gap 110B, beneath microelectronic component 104A and microelectronic component 104C. Second die package 130B may extend horizontally in the x-direction across the component gap 110A, beneath microelectronic component 104A and microelectronic component 104B. In some examples, the die packages 130A-B may extend beneath the microelectronic components 104A-D, for example, into the open areas 124A-D that are devoid of any ball grid components along the first side 112 of each of the plurality of microelectronic components 104A-D.

Figure 4:
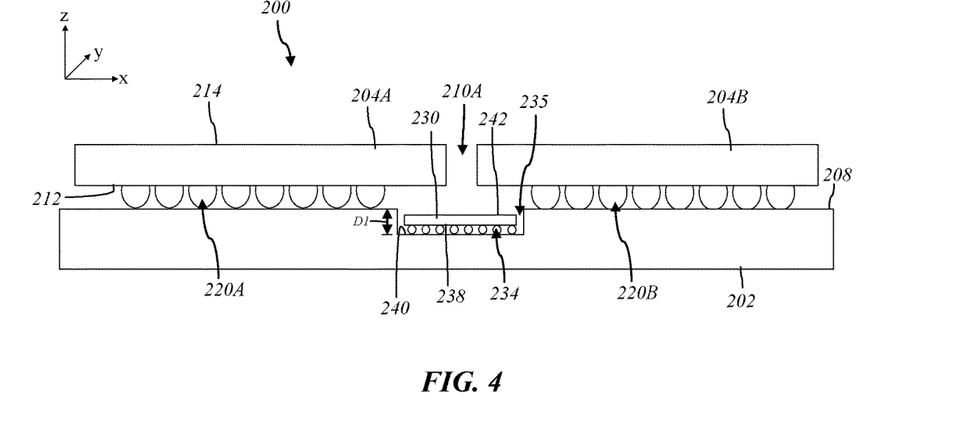
FIG. 4 illustrates a side cross-sectional view of another example microelectronics package.

Turning now to FIG. 4, a package 200 according to example embodiments of the disclosure will be described in greater detail. As shown, the package 200 includes many or all of the features previously described in relation to the package 100 of FIGS. 1-3. As such, only certain aspects of the package 200 will hereinafter be described for the sake of brevity. In this embodiment, the package 200 includes a plurality of microelectronic components 204A-B each having a first side 212 parallel facing the substrate 202, and a second side 214 opposite the first side 212. As shown, the plurality of microelectronic components 204A-B are coupled to a substrate 202, which may have a recess 235 formed therein. For example, the recess 235 may be formed in a first side 208 (e.g., a top side) of the substrate 202 to a depth 'D1.' A die package 230 may be provided within the recess 235 such that the die package 230 is directly physically and electrically coupled to a bottom surface 240 of the recess 235 by a plurality of connection elements 234 (e.g., a solder BGA) extending from the first side 238 of the die package 230. The die package 230 may include a top surface 242 that is recessed below the first side 208 of the substrate 202, for example as shown. In other examples, the die package 230 may have a vertical thickness in the z-direction that causes the top surface 242 of the die package 230 to extend above a plane defined by the first side 208 of the substrate 202. By providing the die package 230 within the recess 235, the overall vertical thickness of the die package 230 may be increased.

Figure 5:
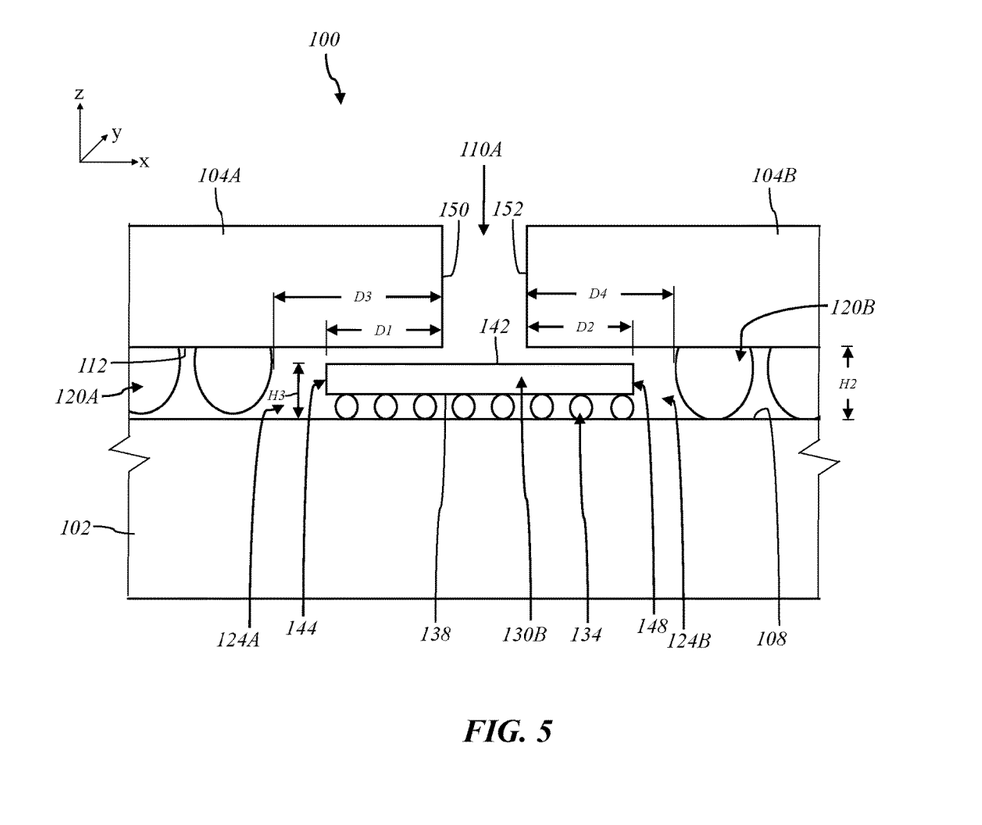
FIG. 5 illustrates a close-up partial view of a die package of the example microelectronics package of FIG. 3.

Turning now to FIG. 5, a close-up partial view of the example package 100 shown in FIG. 3 will be described in greater detail. As shown, the microelectronic components 104A-B are coupled to the first side 108 of the substrate 102 by component connection elements 120A and 120B, respectively. The die package 130B is similarly coupled to the first side 108 of the substrate 102 by the plurality of die connection elements 134 extending from the first side 138 of the die package 130B. As shown, each of the microelectronic components 104A-B extend partially over the die package 130B along the x-axis, an amount represented by distances D1 and D2, respectively. As such, the microelectronic component '104A is vertically aligned (e.g., along the z-axis) over a first portion/end/edge 144 of the die package 130B, and the microelectronic component 104B is vertically aligned over a second portion/end/edge 148 of the die package 130B. Said another way, a footprint defined by each of the microelectronic components 104A-B extends partially over the die package 130B, wherein the footprint represents a projected area of the height and width of each of microelectronic components 104A-B in the x-y plane. In some examples, D1 is equal to, or substantially equal to, D2.

To accommodate the overlap between the die package 130B and the microelectronic components 104A-B, the die package 130B is dimensioned so as to extend across the component gap 110A, which is defined by an open area between interior edges 150 and 152 of the microelectronic components 104A-B, respectively. In some examples, the component gap 110A is a linear distance of approximately 500 μm. Furthermore, as shown, the component gap 110A is aligned over the die package 130B.

The die package 130B is arranged to nest beneath the microelectronic components 104A-B, in the first and second open areas 124A-B, respectively. For example, a distance D3 between an edge of the component connection elements 120A of the microelectronic component 104A and the interior edge 150, as well as a distance D4 between an edge of the component connection elements 120B of the microelectronic component 104B and the interior edge 152, permits horizontal extension in the x-direction of the die package 130B into the first and second open areas 124A-B. In some examples, D3 is equal to, or substantially equal to, D4.

To accommodate vertical stacking of the microelectronic components 104A-B over the die package 130B, a height H2 of the component connection elements 120A and 120B along the z-direction may be selected to be greater than a height H3 of the die package 130, wherein H3 is measured from a top surface 142 of the die package 130B to the first side 108 of the substrate 102. In some examples, the plurality of die connection elements 134 are smaller (e.g., have a lesser height or diameter) than the plurality of component connection elements 120A-B.

According to various embodiments, a choice of material, thickness, and/or other properties of the die packages 130A-B can be selected based on the structure of the package 100 to achieve a desired design for the package 100. The thickness of the die packages 130A-B can be used to determine one or more of the choice of material, thickness, and/or the other properties of the microelectronic components 104A-B. In some embodiments, a reduced vertical thickness (e.g., H3) afforded by a WLCSP die package, enables placement of the WLCSP die package between the first side 112 of each of the microelectronic components 104A-B and the substrate 102.

Figure 6:
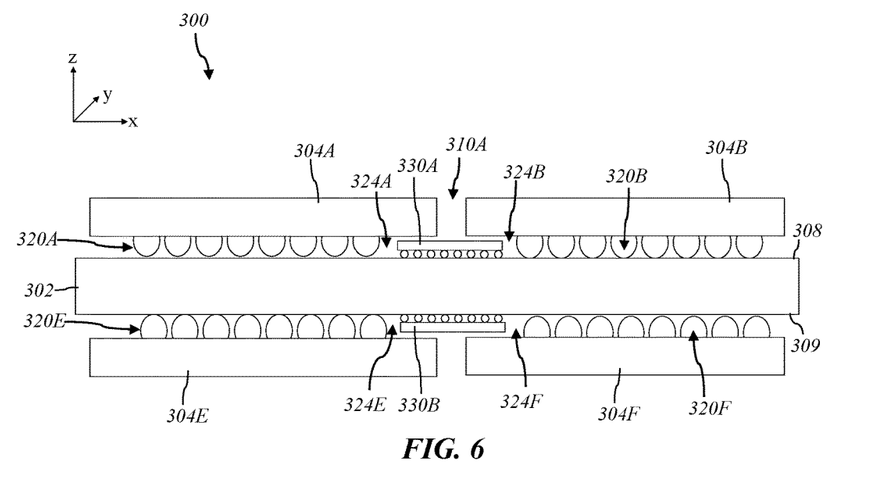
FIG. 6 illustrates a side cross-sectional view of another example microelectronics package.

Turning now to FIG. 6, a package 300 according to example embodiments of the disclosure will be described in greater detail. As shown, the package 300 includes many or all of the features previously described in relation to the package 100 of FIGS. 1-3 and 5. As such, only certain aspects of the package 300 will hereinafter be described for the sake of brevity. In this embodiment, the package 300 includes a substrate 302 having a first side 308 and a second side 309 opposite the first side 308, wherein the first side 308 and the second side 309 are generally parallel to one another. As shown, two or more microelectronic components (e.g., memory packages) 304A-B are provided on the first side 308 of the substrate 302 and two or more microelectronic components (e.g., memory packages) 304E-F are provided on the second side 309 of the substrate 302. In some examples, each of the plurality of microelectronic components 304A-F are respectively coupled to the substrate 302 by component connection elements 320A-F (e.g., solder BGA), wherein the component connection elements 320A-F define one or more open areas 324A-F to accommodate a positioning of a die package therein. In some embodiments, the microelectronic components 304A-B are coupled to the substrate 302 end-to-end, e.g., along a single x-y plane parallel to the first side 308 of the substrate 302. Similarly, the microelectronic components 304E-F may be coupled to the substrate 302 end-to-end, e.g., along a single x-y plane parallel to the second side 309 of the substrate 302.

As shown, the package 300 may further include a first die package 330A coupled to the first side 308 of the substrate 302 in an area within/beneath the one or more open areas 324A-B of microelectronic components 304A-B, respectively. Similarly, the package 300 may further include a second die package 330B coupled to the second side 309 of the substrate 302 in an area within/beneath the one or more open areas 324E-F of microelectronic components 304A-B, respectively. By providing one or more microelectronic components and die packages along each side of the substrate 302, overall memory performance of the package 300 is increased without increasing an x-y footprint of the package 300.

Figure 7:
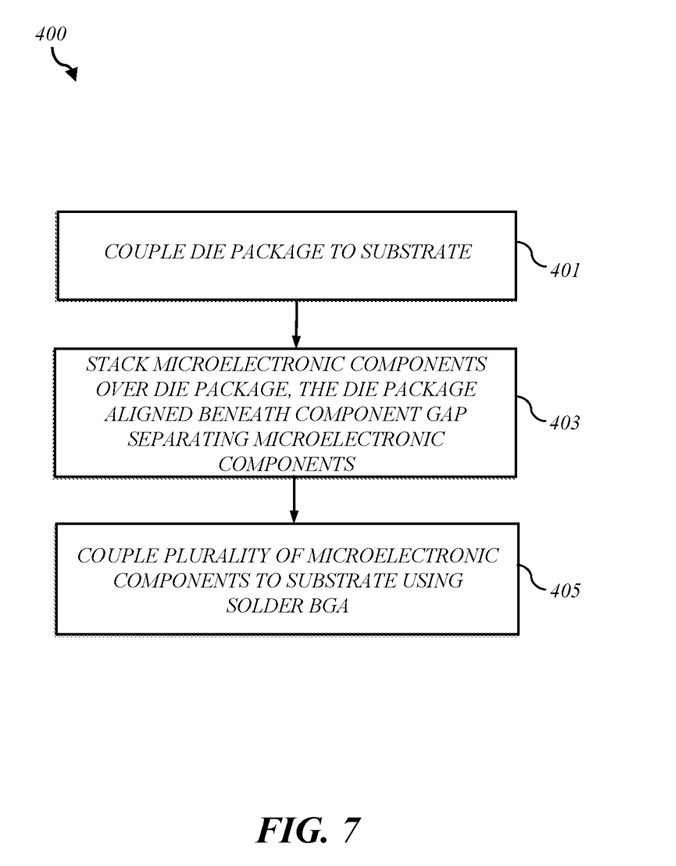
FIG. 7 illustrates an example process flow for forming a microelectronics package.

FIG. 7 illustrates an example process flow 400 for forming a microelectronics package according to examples of the disclosure. Although process flow 400 shown in FIG. 7 has a limited number of elements in a certain process order, it may be appreciated that the process flow 400 may include more or less elements in alternate processes as desired for a given implementation. Furthermore, it should be noted that the process flow 400 may not have to be executed in the order described, or in any particular order. Moreover, various activities described with respect to the process flow 400 can be executed in serial or parallel fashion. The process flow 400 will be described in conjunction with the representations shown in FIGS. 1-6.

The process flow 400 may include coupling a die package to a substrate, as shown at block 401. In some examples, the die package may be a WLCSP die package including a plurality of die connection elements coupling the WLCSP to the substrate. In some examples, the plurality of die connection elements is a solder BGA. In some examples, the substrate can include PoP lands and can include BGA lands. In some examples, the substrate is a PCB.

In some examples, the solder balls of the solder BGA can be attached to the substrate using, for example, a flux printing or a flux spray operation followed by a standard ball placement and reflow process. The solder balls can be deposited so as to be attached or coupled to BGA lands provided on the substrate. The die package may then be attached to the substrate. As part of this process, the die package can undergo a flux dipping and pick up and place operation to position the die package precisely onto the substrate.

The process flow 400 may further include stacking the microelectronic components vertically over the die package, wherein the die package is aligned beneath the component gap separating the microelectronic components, as shown at block 403. In some examples, the plurality of microelectronic components are separated from one another end-to-end by a component gap, wherein the component gap is aligned over the die package. In some examples, the process flow 400 at block 403 includes vertically aligning a first microelectronic component of the plurality of microelectronic components over a first portion of the die package, and vertically aligning another microelectronic component of the plurality of microelectronic components over a second portion of the die package. In some examples, the solder BGA of the plurality of microelectronic components defines one or more open areas devoid of any solder balls along a first side of each of the plurality of microelectronic components. In some examples, the process flow 400 at block 403 further includes positioning the die package within the one or more open areas. In some examples, each of the plurality of microelectronics components is a memory package, for example, a non-volatile memory package (e.g., NAND or a 3D XPoint™).

The process flow 400 further includes coupling the plurality of microelectronic components to the substrate using the solder balls of the solder BGA, as shown at block 405. Coupling can be performed using, for example, a flux printing or a flux spray operation followed by a standard ball placement and reflow process. The solder balls can be deposited so as to be attached or coupled to BGA lands provided on the substrate. The plurality of microelectronic components may then be attached to the substrate. As part of this process, the plurality of microelectronic components can undergo a flux dipping and pick up and place operation to position the plurality of microelectronic components precisely onto the substrate.

Figure 8:
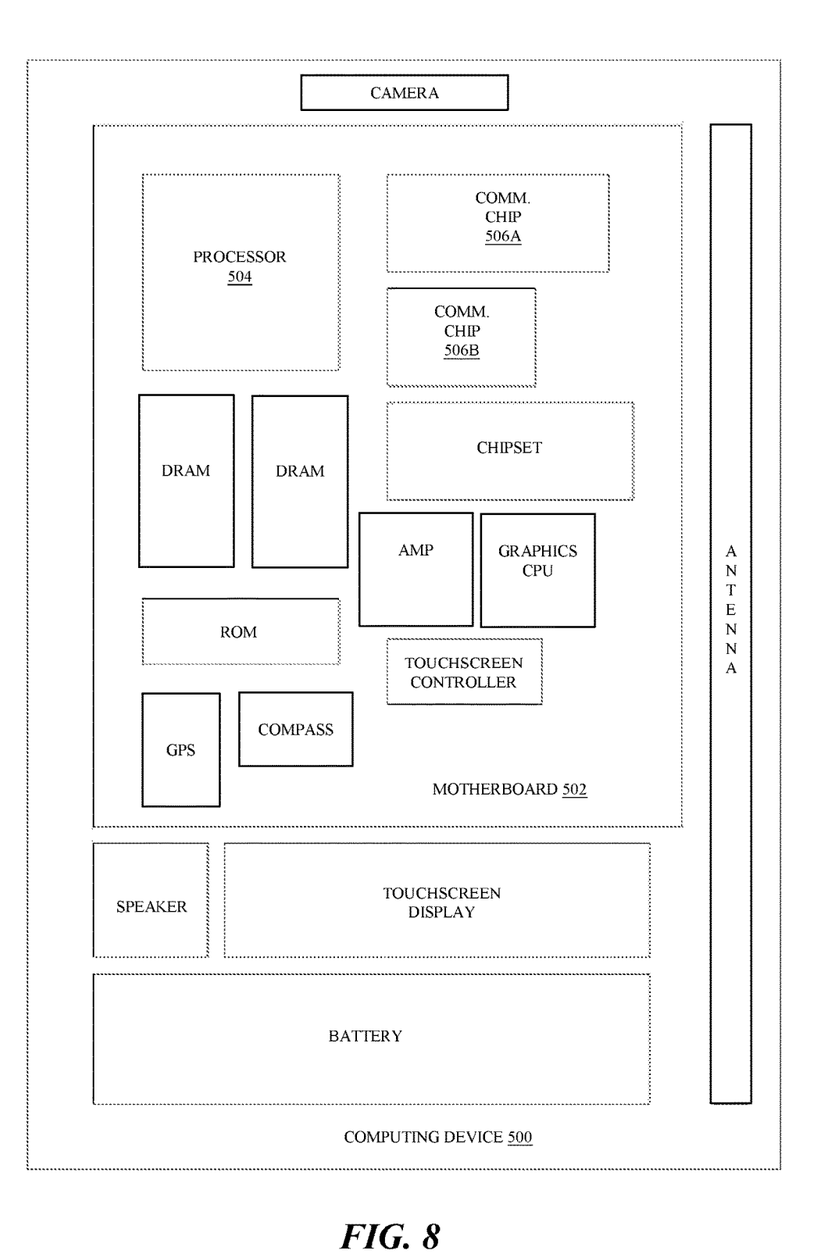
FIG. 8 illustrates an example computing device.

FIG. 8 illustrates a computing device 500 in accordance with one implementation of the present description. The computing device 500 houses a board 502. The board 502 may include a number of components, including but not limited to a processor 504 and at least one communication chip 506A, 506B. The processor 504 is physically and electrically coupled to the board 502. In some implementations the at least one communication chip 506A, 506B is also physically and electrically coupled to the board 502. In further implementations, the communication chip 506A, 506B is part of the processor 504.

Depending on its applications, the computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506A, 506B enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506A, 506B. For instance, a first communication chip 506A may be dedicated to shorter range wireless communications such as Wi-Fi and Bluetooth and a second communication chip 506B may be dedicated to longer range wireless communications such as GPS, EDGE, GPRS, CDMA, WiMAX, LTE, Ev-DO, and others.

The processor 504 of the computing device 500 may include a plurality microelectronic devices/components and die packages arranged within the processor 504. In some implementations of the present description, the processor 504 may include one or more die packages positioned atop the board 502 in an area within/beneath the one or more open areas of the microelectronic components, as described above. The term "processor" may refer to any device or portion of a device that processes electronic data from registers and/or memory to transform that electronic data into other electronic data that may be stored in registers and/or memory.

The communication chip 506A, 506B may include a plurality microelectronic devices packaged within the communication chip 506A, 506B. In accordance with another implementation of the present description, the microelectronic devices of the communication chip may be connected to one another with a bridge having a through-bridge via formed in accordance with implementations described above.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

In sum, the examples and embodiments described herein provide a combined memory package/die package and PCB design assembly that significant increases SSD densities and reduces the overall system size and cost. Furthermore, overall component footprint on the PCB is reduced by utilizing unused Z-space though package stacking, and by using normal PCB assembly processes.

The follow examples pertain to additional examples of technologies disclosed herein.

Example 1

A microelectronics package may include a substrate, a plurality of microelectronic components coupled to the substrate, the plurality of microelectronic components separated from one another by a component gap, and a die package coupled to the substrate, wherein the die package extends across the component gap, and wherein the die package is disposed between the plurality of microelectronic components and the substrate.

Example 2

The microelectronics package of example 1, wherein two or more microelectronics components of the plurality of microelectronic components extend partially over the die package.

Example 3

The microelectronics package of example 1, wherein one microelectronic component of the plurality of microelectronic components is vertically aligned over a first portion of the die package and wherein another microelectronic component of the plurality of microelectronic components is vertically aligned over a second portion of the die package.

Example 4

The microelectronics package of example 1, wherein each of the plurality of microelectronic components includes a first side facing the substrate and a second side opposite the first side, wherein each of the plurality of microelectronic components further includes a plurality of component connection elements extending towards the substrate from the first side.

Example 5

The microelectronics package of example 4, wherein each of the plurality of component connection elements is in electrical and physical contact with the substrate.

Example 6

The microelectronics package of example 4, wherein the plurality of component connection elements define an open area along the first side of the plurality of microelectronic components, wherein the open area is devoid of any component connection elements, and wherein the die package is positioned between the plurality of component connection elements within the open area.

Example 7

The microelectronics package of example 1, wherein the substrate is a printed circuit board, and wherein each of the plurality of microelectronic components is a memory package.

Example 8

The microelectronics package of example 7, wherein the memory package includes solid state non-volatile memory device.

Example 9

The microelectronics package of example 1, wherein the substrate includes a first side and a second side, and wherein two or more microelectronic components of the plurality of microelectronic components are disposed on the first side of the substrate and two or more microelectronic components of the plurality of microelectronic components are disposed on the second side of the substrate.

Example 10

The microelectronics package of example 1, further comprising a recess provided in the substrate, wherein the die package is disposed within the recess.

Example 11

The microelectronics package of example 1, wherein the die package is a wafer level chip scale package.

Example 12

A memory package device may include a printed circuit board (PCB), a plurality of memory packages coupled to the PCB, wherein the plurality of memory packages are separated from one another end-to-end by a component gap, and wherein each of the plurality of memory packages includes a first side facing the PCB and a second side opposite the first side. The memory package device may further include a die package coupled to the PCB, wherein the die package extends across the component gap, and wherein the die package is disposed between the first side of each of the plurality of memory packages and the PCB.

Example 13

The memory package device of example 12, wherein a footprint of each of the plurality of memory packages extends partially over the die package.

Example 14

The memory package device of example 12, wherein one memory package of the plurality of memory packages is vertically aligned over a first end of the die package, and wherein another memory package of the plurality of memory packages is vertically aligned over a second end of the die package.

Example 15

The memory package device of example 14, further comprising a plurality of component connection elements coupling the first side of each of the plurality of memory packages to the PCB.

Example 16

The memory package device of example 15, wherein the plurality of component connection elements define an open area along the first side of the plurality of memory packages, the open area being devoid of any component connection elements, and wherein the die package is positioned between the plurality of component connection elements within the open area.

Example 17

The memory package device of example 12, further comprising a plurality of die connection elements coupling the die package to the PCB.

Example 18

The memory package device of example 12, wherein each memory package of the plurality of memory packages includes a steady state non-volatile memory device.

Example 19

The memory package device of example 12, wherein the substrate includes a first side and a second side, and wherein two or more memory packages of the plurality of memory packages are provided on the first side of the substrate and two or more memory packages of the plurality of memory packages are provided on the second side of the substrate.

Example 20

The memory package device of example 19, further comprising a recess provided in the first side of the substrate, wherein the die package is coupled to the substrate within the recess.

Example 21

A method for forming a microelectronics package may include coupling a die package to the substrate, and coupling a plurality of microelectronic components to the substrate, wherein the plurality of microelectronic components are vertically stacked over the die package, and wherein the plurality of microelectronic components are separated from one another end-to-end by a component gap, the component gap being aligned over the die package.

Example 22

The method according to claim 21, further comprising vertically aligning a first microelectronic component of the plurality of microelectronic components over a first end of the die package, and vertically aligning another microelectronic component of the plurality of microelectronic components over a second end of the die package.

Example 23

The method according to claim 21, further comprising coupling each of the die package and the plurality of microelectronic components to the substrate using a solder ball grid array (BGA).

Example 24

The method according to claim 23, wherein the solder BGA of the plurality of microelectronic components defines one or more open areas devoid of any solder balls along a first side of each of the plurality of microelectronic components, and wherein the die package is positioned within at least one of the one or more open areas, between the substrate and the plurality of microelectronic components.

Example 25

The method according to claim 21, wherein the substrate is a printed circuit board, and wherein each of the plurality of microelectronic components is a memory package.

Example 26

A solid state drive (SSD) device may include a plurality of microelectronic components coupled to a substrate, the plurality of microelectronic components separated from one another by a component gap, and a die package coupled to the substrate, wherein the die package extends across the component gap, and wherein the die package is disposed between the plurality of microelectronic components and the substrate.

Example 27

The SSD device of example 26, wherein two or more microelectronics components of the plurality of microelectronic components extend partially over the die package.

Example 28

The SSD device of example 26, wherein one microelectronic component of the plurality of microelectronic components is vertically aligned over a first portion of the die package and wherein another microelectronic component of the plurality of microelectronic components is vertically aligned over a second portion of the die package.

Example 29

The SSD device of example 26, wherein each of the plurality of microelectronic components includes a first side facing the substrate and a second side opposite the first side, wherein each of the plurality of microelectronic components further includes a plurality of component connection elements extending towards the substrate from the first side.

Example 30

The SSD device of example 29, wherein each of the plurality of component connection elements is in electrical and physical contact with the substrate.

Example 31

The SSD device of example 29, wherein the plurality of component connection elements define an open area along the first side of the plurality of microelectronic components, wherein the open area is devoid of any component connection elements, and wherein the die package is positioned between the plurality of component connection elements within the open area.

Example 32

The SSD device of example 26, wherein the substrate is a printed circuit board, and wherein each of the plurality of microelectronic components is a memory package.

Example 33

The SSD device of example 32, wherein the memory package includes solid state non-volatile memory device.

Example 34

The SSD device of example 26, wherein the substrate includes a first side and a second side, and wherein two or more microelectronic components of the plurality of microelectronic components are disposed on the first side of the substrate and two or more microelectronic components of the plurality of microelectronic components are disposed on the second side of the substrate.

Example 35

The SSD device of example 26, further comprising a recess provided in the substrate, wherein the die package is disposed within the recess.

Example 36

The SSD device of example 26, wherein the die package is a wafer level chip scale package.

Example 37

A method for forming a solid state drive (SSD) device may include coupling a die package to the substrate, and coupling a plurality of microelectronic components to the substrate, wherein the plurality of microelectronic components are vertically stacked over the die package, and wherein the plurality of microelectronic components are separated from one another end-to-end by a component gap, the component gap being aligned over the die package.

Example 38

The method according to claim 37, further comprising vertically aligning a first microelectronic component of the plurality of microelectronic components over a first end of the die package, and vertically aligning another microelectronic component of the plurality of microelectronic components over a second end of the die package.

Example 39

The method according to claim 37, further comprising coupling each of the die package and the plurality of microelectronic components to the substrate using a solder ball grid array (BGA).

Example 40

The method according to claim 39, wherein the solder BGA of the plurality of microelectronic components defines one or more open areas devoid of any solder balls along a first side of each of the plurality of microelectronic components, and wherein the die package is positioned within at least one of the one or more open areas, between the substrate and the plurality of microelectronic components.

Example 41

The method according to claim 37, wherein the substrate is a printed circuit board, and wherein each of the plurality of microelectronic components is a memory package.

Example 42

A microelectronics memory package assembly may include a substrate, and a plurality of microelectronic components coupled to the substrate, the plurality of microelectronic components separated from one another by a component gap. The microelectronics memory package assembly may further include a die package coupled to the substrate, wherein the die package extends across the component gap, and wherein the die package is disposed between the plurality of microelectronic components and the substrate.

Example 43

The microelectronics memory package assembly of example 42, wherein two or more microelectronics components of the plurality of microelectronic components extend partially over the die package.

Example 44

The microelectronics memory package assembly of example 42, wherein one microelectronic component of the plurality of microelectronic components is vertically aligned over a first portion of the die package and wherein another microelectronic component of the plurality of microelectronic components is vertically aligned over a second portion of the die package.

Example 45

The microelectronics memory package assembly of example 42, wherein each of the plurality of microelectronic components includes a first side facing the substrate and a second side opposite the first side, wherein each of the plurality of microelectronic components further includes a plurality of component connection elements extending towards the substrate from the first side.

Example 46

The microelectronics memory package assembly of example 45, wherein each of the plurality of component connection elements is in electrical and physical contact with the substrate.

Example 47

The microelectronics memory package assembly of example 45, wherein the plurality of component connection elements define an open area along the first side of the plurality of microelectronic components, wherein the open area is devoid of any component connection elements, and wherein the die package is positioned between the plurality of component connection elements within the open area.

Example 48

The microelectronics memory package assembly of example 42, wherein the substrate is a printed circuit board, and wherein each of the plurality of microelectronic components is a memory package.

Example 49

The microelectronics memory package assembly of example 48, wherein the memory package includes solid state non-volatile memory device.

Example 50

The microelectronics memory package assembly of example 42, wherein the substrate includes a first side and a second side, and wherein two or more microelectronic components of the plurality of microelectronic components are disposed on the first side of the substrate and two or more microelectronic components of the plurality of microelectronic components are disposed on the second side of the substrate.

Example 51

The microelectronics memory package assembly of example 42, further comprising a recess provided in the substrate, wherein the die package is disposed within the recess.

Example 52

The microelectronics memory package assembly of example 42, wherein the die package is a wafer level chip scale package.

Numerous specific details have been set forth herein to provide a thorough understanding of the embodiments. It will be understood by those skilled in the art, however, that the embodiments may be practiced without these specific details. In other instances, well-known operations, components, and structures have not been described in detail so as not to obscure the embodiments. It can be appreciated that the specific structural and functional details disclosed herein may be representative and do not necessarily limit the scope of the embodiments.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

As used herein, the terms "over", "to", "between" and "on" may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Further, the terms "attached" and "coupled" may mean directly adjacent to or in direct contact with another element or may mean in a close physical relationship with another element without being directly adjacent to or in direct contact with the other element.

Furthermore, various embodiments herein have been described in the context of one or more elements or components. An element or component may comprise any structure arranged to perform certain operations. Although an embodiment may be described with a limited number of elements in a certain topology by way of example, the embodiment may include more or less elements in alternate topologies as desired for a given implementation. It is worthy to note that any reference to "one embodiment" or "an embodiment" means that a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:
1. A microelectronics package comprising:
a substrate;
a plurality of microelectronic components coupled to the substrate, each of the plurality of microelectronic components includes a first side facing the substrate and a second side opposite the first side, the plurality of microelectronic components separated from one another by a component gap;
a set of external component connection elements for each of the plurality of microelectronic components, the plurality of sets of external component connection elements extending towards the substrate from the first side, wherein each set of the plurality of sets of external component connection elements defines an open area along the first side of the respective one of the plurality of microelectronic components, wherein the open area is devoid of any external component connection elements; and
a die package directly coupled to the substrate, wherein the die package extends across the component gap, and wherein the die package is disposed between the plurality of microelectronic components and the substrate entirely within the open area as seen in a plan view.

2. The microelectronics package of claim 1, wherein two or more of the plurality of microelectronic components extend partially over the die package.

3. The microelectronics package of claim 1, wherein one microelectronic component of the plurality of microelectronic components is vertically aligned over a first portion of the die package and wherein another microelectronic component of the plurality of microelectronic components is vertically aligned over a second portion of the die package.

4. The microelectronics package of claim 1, wherein each set of the plurality of sets of external component connection elements is in electrical and physical contact with the substrate.

5. The microelectronics package of claim 1, wherein the substrate is a printed circuit board, and wherein each of the plurality of microelectronic components is a memory package.

6. The microelectronics package of claim 5, wherein the memory package includes a solid state non-volatile memory device.

7. The microelectronics package of claim 1, wherein the substrate includes a first side and a second side, and wherein two or more microelectronic components of the plurality of microelectronic components are disposed on the first side of the substrate and two or more microelectronic components of the plurality of microelectronic components are disposed on the second side of the substrate.

8. The microelectronics package of claim 1, further comprising a recess provided in the substrate, wherein the die package is disposed within the recess.

9. The microelectronics package of claim 1, wherein the die package is a wafer level chip scale package.

10. A memory package device comprising:
a printed circuit board (PCB);
a plurality of memory packages coupled to the PCB, wherein the plurality of memory packages are separated from one another end-to-end by a component gap, and wherein each of the plurality of memory packages includes a first side facing the PCB and a second side opposite the first side;
a set of external component connection elements for each of the plurality of memory packages, the plurality of sets of external component connection elements extending towards the PCB from the first side, wherein each set of the plurality of sets of external component connection elements defines an open area along the first side of the respective one of the plurality of memory packages, wherein the open area is devoid of any external component connection elements; and a die package directly coupled to the PCB, wherein the die package extends across the component gap, and wherein the die package is disposed between the first side of each of the plurality of memory packages and the PCB entirely within the open area as seen in a plan view.

11. The memory package device of claim 10, wherein a footprint of two or more memory packages of the plurality of memory packages extends partially over the die package.

12. The memory package device of claim 10, wherein one memory package of the plurality of memory packages is vertically aligned over a first edge of the die package, and wherein another memory package of the plurality of memory packages is vertically aligned over a second edge of the die package.

13. The memory package device of claim 10, further comprising a plurality of die connection elements coupling the die package to the PCB.

14. The memory package device of claim 10, wherein each memory package of the plurality of memory packages includes a steady state non-volatile memory device.

15. The memory package device of claim 10, wherein the PCB includes a first side and a second side, and wherein two or more memory packages of the plurality of memory packages are provided on the first side of the PCB and two or more memory packages of the plurality of memory packages are provided on the second side of the PCB.

16. The memory package device of claim 15, further comprising a recess provided in the first side of the PCB, wherein the die package is coupled to the PCB within the recess.

* * * * *